(12) United States Patent
Chen et al.

(10) Patent No.: US 11,972,800 B2
(45) Date of Patent: Apr. 30, 2024

(54) NON-VOLATILE MEMORY CELL AND NON-VOLATILE MEMORY CELL ARRAY

(71) Applicant: eMemory Technology Inc., Hsin-Chu (TW)

(72) Inventors: Chih-Chun Chen, Hsinchu County (TW); Chun-Hung Lin, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 150 days.

(21) Appl. No.: 17/888,526

(22) Filed: Aug. 16, 2022

(65) Prior Publication Data

US 2023/0197156 A1 Jun. 22, 2023

Related U.S. Application Data

(60) Provisional application No. 63/361,376, filed on Dec. 16, 2021.

(51) Int. Cl.
| | |
|---|---|
| *G11C 16/04* | (2006.01) |
| *G11C 16/10* | (2006.01) |
| *G11C 16/26* | (2006.01) |

(52) U.S. Cl.
CPC ............ *G11C 16/045* (2013.01); *G11C 16/10* (2013.01); *G11C 16/26* (2013.01)

(58) Field of Classification Search
CPC .................................................. H01L 27/11524
See application file for complete search history.

(56) References Cited

U.S. PATENT DOCUMENTS

| | | | |
|---|---|---|---|
| 6,950,342 B2 | 9/2005 | Lindhorst et al. | |
| 10,783,960 B2 | 9/2020 | Kuo | |
| 2007/0228451 A1* | 10/2007 | Georgescu | ............. H10B 69/00 438/257 |

\* cited by examiner

*Primary Examiner* — Jason Lappas
(74) *Attorney, Agent, or Firm* — WPAT, P.C (57) ABSTRACT

A non-volatile memory cell includes a first select transistor, a first floating gate transistor, a second floating gate transistor and a second select transistor. The first select transistor is connected with a program source line and a program word line. The first floating gate transistor includes a floating gate. The first floating gate transistor is connected with the first select transistor and a program bit line. The second floating gate transistor includes a floating gate. The second floating gate transistor is connected with a read source line. The second select transistor is connected with the second floating gate transistor, the read word line and the read bit line. The floating gate of the second floating gate transistor is connected with the floating gate of the first floating gate transistor.

17 Claims, 6 Drawing Sheets

| | PGM | Read |
|---|---|---|
| | 1st/2nd | |
| SLP | Vpp | Vdd |
| BLP | 0V/Vpp | Vdd |
| WLP | 0V/Vpp | Vdd |
| SLR | 0V | Vdd |
| BLR | 0V | 0V |
| WLR | 0V | Vdd |
| $V_{NW}$ | Vpp | Vdd |
| $V_{PW}$ | 0V | 0V |

NON-VOLATILE MEMORY CELL AND NON-VOLATILE MEMORY CELL ARRAY

This application claims the benefit of U.S. provisional application Ser. No. 63/361,376, filed Dec. 16, 2021, the subject matter of which is incorporated herein by reference.

FIELD OF THE INVENTION

The present invention relates to a memory cell and a memory cell array, and more particularly to a non-volatile memory cell and a non-volatile memory cell array.

BACKGROUND OF THE INVENTION

Figure 1:
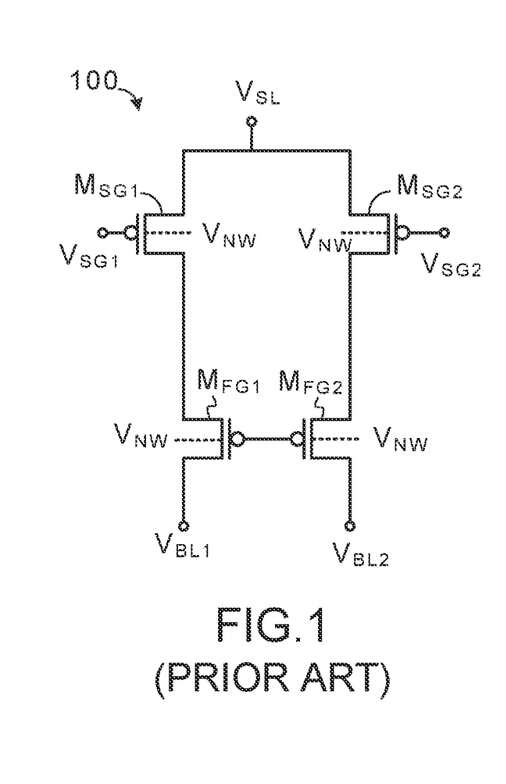
FIG. 1 (prior art) is a schematic equivalent circuit diagram of a conventional non-volatile memory cell.

In U.S. Pat. No. 10,783,960, a non-volatile memory cell and a non-volatile cell array are disclosed. FIG. 1 is a schematic equivalent circuit diagram of a conventional non-volatile memory cell.

As shown in FIG. 1, the non-volatile memory cell 100 comprises four p-type transistors. The four p-type transistors comprise a first select transistor $M_{SG1}$, a first floating gate transistor $M_{FG1}$, a second select transistor $M_{SG2}$ and a second floating gate transistor $M_{FG2}$. The first select transistor $M_{SG1}$ and the first floating gate transistor $M_{FG1}$ are serially connected with each other. The second select transistor $M_{SG2}$ and the second floating gate transistor $M_{FG2}$ are serially connected with each other. The body terminals of the first select transistor $M_{SG1}$, the second select transistor $M_{SG2}$, the first select transistor $M_{SG1}$ and the second select transistor $M_{SG2}$ receive an N-well voltage $V_{NW}$.

The first source/drain terminal of the first select transistor $M_{SG1}$ receives a source line voltage $V_{SL}$. The gate terminal of the first select transistor $M_{SG1}$ receives a first select gate voltage $V_{SG1}$. The second source/drain terminal of the first select transistor $M_{SG1}$ is connected with the first source/drain terminal of the first floating gate transistor $M_{FG1}$. The second source/drain terminal of the first floating gate transistor $M_{FG1}$ receives a first bit line voltage $V_{BL1}$.

The first source/drain terminal of the second select transistor $M_{SG2}$ receives the source line voltage $V_{SL}$. The gate terminal of the second select transistor $M_{SG2}$ receives a second select gate voltage $V_{SG2}$. The second source/drain terminal of the second select transistor $M_{SG2}$ is connected with the first source/drain terminal of the second floating gate transistor $M_{FG2}$. The second source/drain terminal of the second floating gate transistor $M_{FG2}$ receives a second bit line voltage $V_{BL2}$. Moreover, the floating gate of the first floating gate transistor $M_{FG1}$ and the floating gate of the second floating gate transistor $M_{FG2}$ are connected with each other.

The first select transistor $M_{SG1}$, the first floating gate transistor $M_{FG1}$ and the second floating gate transistor $M_{FG2}$ are constructed in a medium voltage N-well region (MV NW), and the second select transistor $M_{SG2}$ is constructed in a low voltage N-well region (LV NW). That is, the first select transistor $M_{SG1}$, the first floating gate transistor $M_{FG1}$ and the second floating gate transistor $M_{FG2}$ are medium voltage devices (MV devices). The gate oxide layers of these MV devices are thick enough to withstand the higher voltage stress. The second select transistor $M_{SG2}$ is a low voltage device (LV device). Since the gate oxide layer of the LV device is thinner, the LV device is unable to withstand the higher voltage stress. However, the operation speed of the LV device is faster.

While a program action is performed, the source line voltage $V_{SL}$ of the non-volatile memory cell 100 needs to receive a higher program voltage (e.g., 7V~12V). Moreover, the first select transistor $M_{SG1}$ and the second select transistor $M_{SG2}$ receive the program voltage simultaneously. In case that the LV device (i.e., the second select transistor $M_{SG2}$) is suffered from breakdown, the non-volatile memory cell 100 is damaged. For solving this drawback, the bias voltages applied to various terminals of the second select transistor $M_{SG2}$ need to be specially designed during the program action. Consequently, the voltage stress applied to the second select gate transistor $M_{SG2}$ is not very large.

SUMMARY OF THE INVENTION

An embodiment of the present invention provides a non-volatile memory cell array. The non-volatile memory cell array includes a first non-volatile memory cell. The first non-volatile memory cell includes a first select transistor, a first floating gate transistor, a second floating gate transistor and a second select transistor. A first source/drain terminal of the first select transistor is connected with a program source line. A gate terminal of the first select transistor is connected with a first program word line. A first source/drain terminal of the first floating gate transistor is connected with a second source/drain terminal of the first select transistor. A second source/drain terminal of the first floating gate transistor is connected with a first program bit line. A first source/drain terminal of the second floating gate transistor is connected with a read source line. A floating gate of the second floating gate transistor is connected with a floating gate of the first floating gate transistor. A first drain/source terminal of the second select transistor is connected with a second source/drain terminal of the second floating gate transistor. A gate terminal of the second select transistor is connected with a first read word line. A second source/drain terminal of the second select transistor is connected with a first read bit line.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 2A:
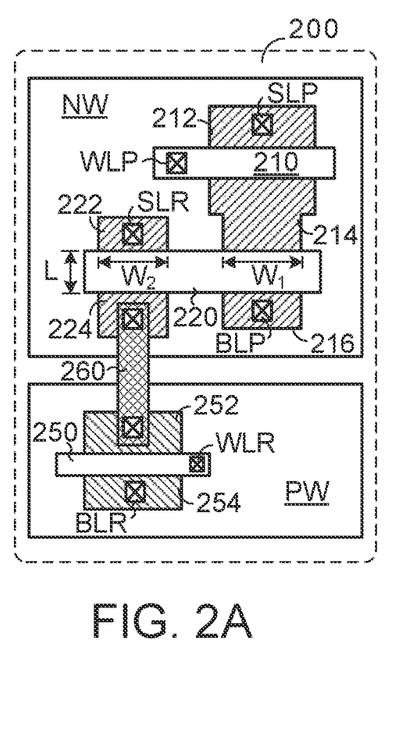
FIG. 2A is a schematic top view illustrating a non-volatile memory cell according to an embodiment of the present invention.
Figure 2B:
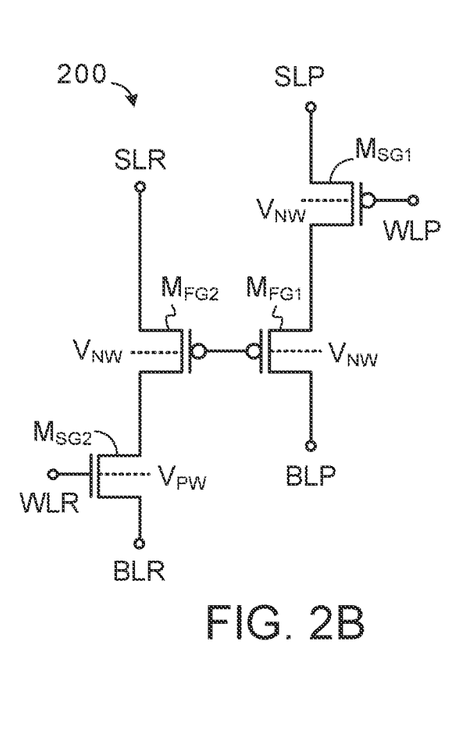
FIG. 2B is a schematic equivalent circuit diagram of the non-volatile memory cell according to the embodiment of the present invention.

Please refer to FIGS. 2A, and 2B. FIG. 2A is a schematic top view illustrating a non-volatile memory cell according to an embodiment of the present invention. FIG. 2B is a schematic equivalent circuit diagram of the non-volatile memory cell according to the embodiment of the present invention.

An MV device manufacturing process of a non-volatile memory cell 200 will be described as follows. Firstly, a N-well region NW is formed in a surface of a semiconductor substrate. Then, two gate structures 210 and 220 are formed over the N-well region NW. Each of the two gate structures 210 and 220 comprises a gate oxide layer and a polysilicon gate layer. The gate oxide layer is contacted with the surface of the N-well region NW. The polysilicon gate layer covers the gate oxide layer.

Then, plural separate p-type doped regions 212, 214, 216, 222 and 224 are formed. The p-type doped region 212 is located beside a first side of the gate structure 210. The p-type doped region 214 is arranged between a second side of the gate structure 210 and the first side of the gate structure 220. The p-type doped region 216 is located beside a second side of the gate structure 220. The p-type doped region 222 is located beside the first side of the gate structure 220. The p-type doped region 224 is located beside the second side of the gate structure 220.

The p-type doped region 212, the gate structure 210 and the p-type doped region 214 are collaboratively formed as a first select transistor. The p-type doped region 214, the gate structure 220 and the p-type doped region 216 are collaboratively formed as a first floating gate transistor. The p-type doped region 222, the gate structure 220 and the p-type doped region 224 are collaboratively formed as a second floating gate transistor. Moreover, the first select transistor, the first floating gate transistor and the second floating gate transistor are p-type transistors.

In the LV device manufacturing process, a P-well region PW is also formed in the surface of the semiconductor substrate. Moreover, a gate structure 250 is formed over the P-well region PW. Similarly, the gate structure 250 comprises a gate oxide layer and a polysilicon gate layer.

Then, two separate n-type doped regions 252 and 254 are formed. The n-type doped region 252 is located beside a first side of the gate structure 250. The n-type doped region 254 is located beside a second side of the gate structure 250. The n-type doped region 252, the gate structure 250 and the n-type doped region 254 are collaboratively formed as a second select transistor. Moreover, the second select transistor is an n-type transistor.

Then, a line connection process is performed. The p-doped region 212 is connected with a program source line SLP. The p-doped region 216 is connected with a program bit line BLP. The p-doped region 222 is connected with a read source line SLR. The gate structure 210 is connected with a program word line WLP. The n-type doped region 254 is connected with a read bit line BLR. The gate structure 250 is connected with a read word line WLR. In addition, the p-type doped region 224 and the n-type doped region 252 are connected with each other through a metal layer 260. That is, the polysilicon gate layer of the gate structure 210 is connected with the program word line WLP, and the polysilicon gate layer of the gate structure 250 is connected with the read word line WLR.

Please refer to FIG. 2B. The non-volatile memory cell 200 comprises a first select transistor $M_{SG1}$, a first floating gate transistor $M_{FG1}$, a second floating gate transistor $M_{FG2}$ and a second select transistor $M_{SG2}$. The first select transistor $M_{SG1}$, the first floating gate transistor $M_{FG1}$ and the second floating gate transistor $M_{FG2}$ are included in the region corresponding to the N-well region NW. The second select transistor $M_{SG2}$ is included in the region corresponding to the P-well region PW. The body terminals of the first select transistor $M_{SG1}$, the first floating gate transistor $M_{FG1}$ and the second floating gate transistor $M_{FG2}$ receive a well voltage $V_{NW}$. The body terminal of the second select transistor $M_{SG2}$ receives a well voltage $V_{PW}$.

The first select transistor $M_{SG1}$ and the first floating gate transistor $M_{FG1}$ are serially connected with each other to define a program path of the non-volatile memory cell 200. The second select transistor $M_{SG2}$ and the second floating gate transistor $M_{FG2}$ are serially connected with each other to define a read path of the non-volatile memory cell 200. In addition, the floating gate of the first floating gate transistor $M_{FG1}$ and the floating gate of the second floating gate transistor $M_{FG2}$ are connected with each other.

The first source/drain terminal of the first select transistor $M_{SG1}$ is connected with the program source line SLP. The gate terminal of the first select transistor $M_{SG1}$ is connected with the program word line WLP. The second source/drain terminal of the first select transistor $M_{SG1}$ is connected with the first source/drain terminal of the first floating transistor $M_{FG1}$. The second source/drain terminal of the first floating transistor $M_{FG1}$ is connected with the program bit line BLP. The first source/drain terminal of the second floating transistor $M_{FG2}$ is connected with the read source line SLR. The second source/drain terminal of the second floating transistor $M_{FG2}$ is connected with the first source/drain terminal of the second select transistor $M_{SG2}$. The gate terminal of the second select transistor $M_{SG2}$ is connected with the read word line WLR. The second source/drain terminal of the second select transistor $M_{SG2}$ is connected with the read bit line BLR.

As mentioned above, the first floating gate transistor $M_{FG1}$ and the second floating gate transistor $M_{FG2}$ have the shared floating gate. That is, the floating gate of the first floating gate transistor $M_{FG1}$ and the floating gate of the second floating gate transistor $M_{FG2}$ are connected with each other.

The first select transistor $M_{SG1}$, the first floating gate transistor $M_{FG1}$ and the second floating gate transistor $M_{FG2}$ are medium voltage devices (MV devices). The second select transistor $M_{SG2}$ is a low voltage device (LV device). In other words, the gate oxide layer of the gate structure 210 is thicker than the gate oxide layer of the gate structure 250, and the gate oxide layer of the gate structure 220 is thicker than the gate oxide layer of the gate structure 250.

In other words, the gate oxide layer of the first select transistor $M_{SG1}$ is thicker than the gate oxide layer of the second select transistor $M_{SG2}$, the gate oxide layer of the first floating gate transistor $M_{FG1}$ is thicker than the gate oxide layer of the second select transistor $M_{SG2}$, and the gate oxide layer of the second floating gate transistor $M_{FG2}$ is thicker than the gate oxide layer of the second select transistor $M_{SG2}$. In addition, the thickness of the gate oxide layer of the first select transistor $M_{SG1}$, the thickness of the gate oxide layer of the first floating gate transistor $M_{FG1}$ and the thickness of the gate oxide layer of the second floating gate transistor $M_{FG2}$ are identical.

Please refer to FIG. 2A again. The area of the active region of the first floating gate transistor $M_{FG1}$ in the gate structure 220 is equal to $L \times W_1$, wherein $W_1$ is the channel width of the first floating gate transistor $M_{FG1}$, and L is the channel length of the first floating gate transistor $M_{FG1}$. The area of the active region of the second floating gate transistor $M_{FG2}$ in the gate structure 220 is equal to $L \times W_2$, wherein $W_2$ is the channel width of the second floating gate transistor $M_{FG2}$, and L is the channel length of the second floating gate transistor $M_{FG2}$. By properly designing the areas of the active regions of the two floating gate transistor $M_{FG1}$ and $M_{FG2}$, the programing efficiency or the reading efficiency of the non-volatile memory cell 200 is enhanced. For example, in case that the area of the active region of the first floating gate transistor $M_{FG1}$ is larger than the area of the active region of the second floating gate transistor $M_{FG2}$ (i.e., $L \times W_1 > L \times W_2$), the non-volatile memory cell 200 has the better programing efficiency. Whereas, in case that the area of the active region of the second floating gate transistor $M_{FG2}$ is larger than the area of the active region of the first floating gate transistor $M_{FG1}$ (i.e., $L \times W_2 > L \times W_1$), the non-volatile memory cell 200 has the better reading efficiency. In some embodiments, the area of the active region of the first floating gate transistor $M_{FG1}$ and the area of the active region of the second floating gate transistor $M_{FG2}$ are identical.

In the above embodiment, the channel width of the first floating gate transistor $M_{FG1}$ and the channel width of the second floating gate transistor $M_{FG2}$ are different. In some embodiments, the channel length of the first floating gate transistor $M_{FG1}$ and the channel length of the second floating gate transistor $M_{FG2}$ are different. Consequently, the area of the active region of the first floating gate transistor $M_{FG1}$ and the area of the active region of the second floating gate transistor $M_{FG2}$ are different.

Moreover, since the gate oxide layer of the second select transistor $M_{SG2}$ is thinner, the threshold voltages of the second select transistor $M_{SG2}$ is lower. Consequently, the read path of the non-volatile memory cell 200 is suitable for the low voltage operation, and the read speed of the non-volatile memory cell 200 is enhanced. The operations of the non-volatile memory cell 200 will be described as follows.

Figure 3A:
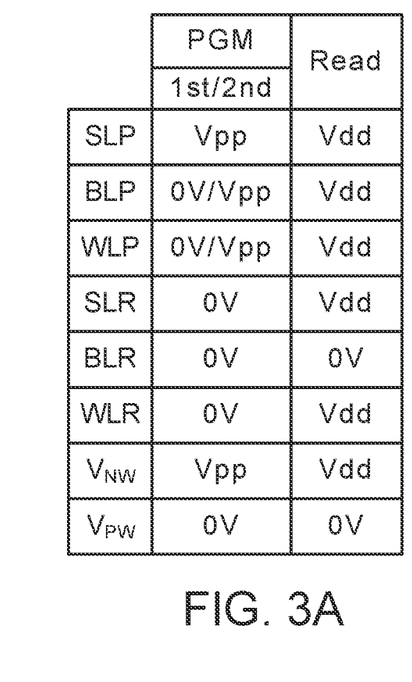
FIG. 3A is a bias voltage table illustrating the bias voltages for performing a program action and a read action on the non-volatile memory cell of the present invention.
Figure 3B:
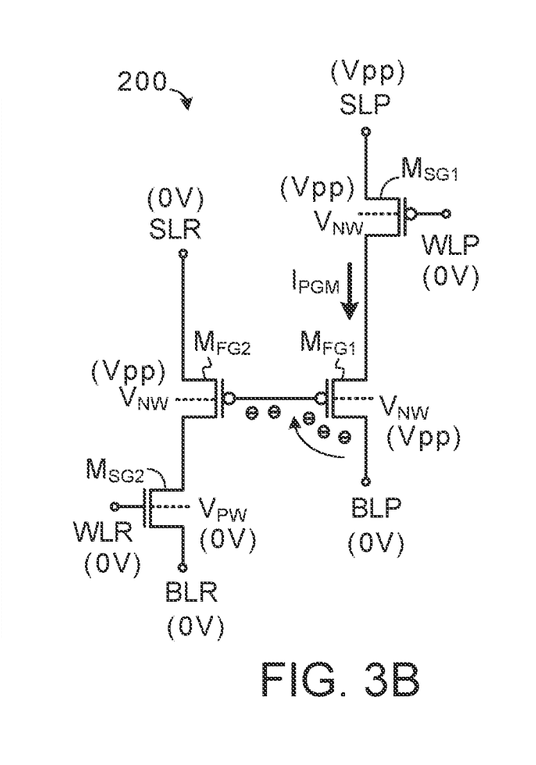
FIGS. 3B and 3C are schematic circuit diagrams illustrating the operations of performing the program action on the non-volatile memory cell of the present invention.
Figure 3C:
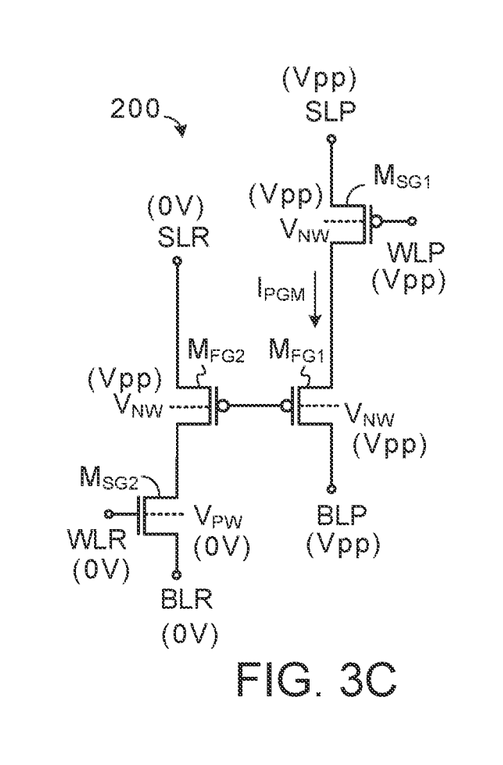
Figure 3D:
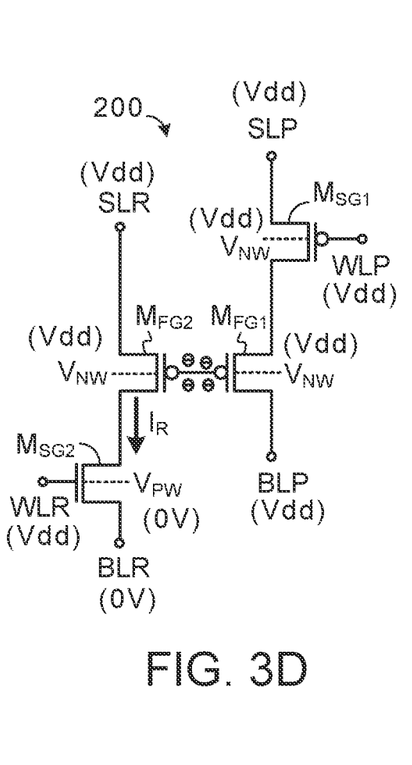
FIGS. 3D and 3E are schematic circuit diagrams illustrating the operations of performing the read action on the non-volatile memory cell of the present invention.
Figure 3E:
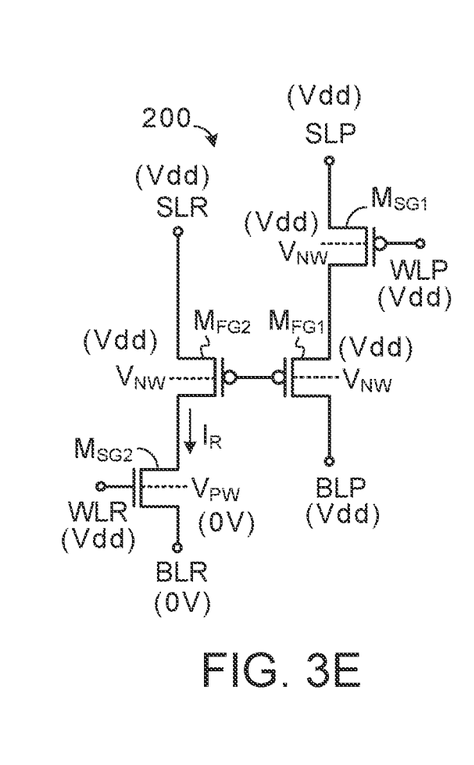

FIG. 3A is a bias voltage table illustrating the bias voltages for performing a program action and a read action on the non-volatile memory cell of the present invention. FIGS. 3B and 3C are schematic circuit diagrams illustrating the operations of performing the program action on the non-volatile memory cell of the present invention. FIGS. 3D and 3E are schematic circuit diagrams illustrating the operations of performing the read action on the non-volatile memory cell of the present invention.

While the program action (PGM) is performed, proper bias voltages are provided to the non-volatile memory cell 200. Consequently, hot carriers are injected into the floating gate, and the non-volatile memory cell 200 is programmed to a first storage state. Alternatively, hot carriers are not injected into the floating gate, and the non-volatile memory cell 200 is programmed to a second storage state.

Please refer to FIG. 3A. For programming the non-volatile memory cell 200 to the first storage state, the program source line SLP receives a first voltage Vpp, the program bit line BLP receives a ground voltage (0V), the program word line WLP receives the ground voltage (0V), the read source line SLR receives the ground voltage (0V), the read bit line BLR receives the ground voltage (0V), the read word line WLR receives the ground voltage (0V), the well voltage $V_{NW}$ is the first voltage Vpp, and the well voltage $V_{PW}$ is the ground voltage (0V). The first voltage Vpp is a program voltage. In addition, the magnitude of the first voltage Vpp is in the range between 5.0V and 12V.

Please refer to FIG. 3B. During the program action (PGM), the read word line WLR and the read bit line BLR in the read path receive the ground voltage (0V). Moreover, the second select transistor $M_{SG2}$ is turned off. That is, the read path is turned off. In the program path, the program word line WLP receives the ground voltage (0V), and the first select transistor $M_{SG1}$ is turned on. Consequently, a higher program current $I_{PGM}$ is generated in the program path. The program current $I_{PGM}$ flows through the first floating gate transistor $M_{FG1}$. Consequently, hot carriers (e.g., electrons) are injected from a channel region of the first floating gate transistor $M_{FG1}$ into the floating gate of the first floating gate transistor $M_{FG1}$. Under this circumstance, the non-volatile memory cell 200 is programmed to the first storage state.

Please refer to FIG. 3A. For programming the non-volatile memory cell 200 to the second storage state, the program source line SLP receives the first voltage Vpp, the program bit line BLP receives the first voltage Vpp, the program word line WLP receives the first voltage Vpp, the read source line SLR receives the ground voltage (0V), the read bit line BLR receives the ground voltage (0V), the read word line WLR receives the ground voltage (0V), the well voltage $V_{NW}$ is the first voltage Vpp, and the well voltage $V_{PW}$ is the ground voltage (0V).

During the program action (PGM), the read path is turned off. In the program path, the program word line WLP receives the first voltage Vpp, and the first select transistor $M_{SG1}$ is turned off. The magnitude of the program current $I_{PGM}$ in the program path is very low (i.e., nearly zero). Consequently, hot carriers (e.g., electrons) cannot be injected into the floating gate of the first floating gate transistor $M_{FG1}$. Under this circumstance, the non-volatile memory cell 200 is programmed to the second storage state.

Please refer to FIG. 3C. In the above embodiment, during the program action, the first voltage Vpp is provided to both of the program bit line BLP and the program word line WLP. Consequently, the non-volatile memory cell 200 is programmed to the second storage state.

In some other embodiments, the first voltage Vpp is provided to one of the program bit line BLP and the program word line WLP, and thus the non-volatile memory cell 200 is programmed to the second storage state. For example, in the program path, the program source line SLP receives the first voltage Vpp, the program bit line BLP receives the ground voltage (0V), and the program word line WLP receives the first voltage Vpp. Consequently, the non-volatile memory cell 200 is programmed to the second storage state. Alternatively, the program source line SLP receives the first voltage Vpp, the program bit line BLP receives the first voltage Vpp, and the program word line WLP receives the ground voltage (0V). Consequently, the non-volatile memory cell 200 is programmed to the second storage state.

Please refer to FIG. 3A. For reading the non-volatile memory cell 200, the program source line SLP receives a second voltage Vdd, the program bit line BLP receives the second voltage Vdd, the program word line WLP receives the second voltage Vdd, the read source line SLR receives the second voltage Vdd, the read bit line BLR receives the ground voltage (0V), the read word line WLR receives the second voltage Vdd, the well voltage $V_{NW}$ is the second voltage Vdd, and the well voltage $V_{PW}$ is the ground voltage (0V). The second voltage Vdd is a read voltage. The second voltage Vdd is lower than the first voltage Vpp. In addition, the magnitude of the second voltage Vdd is in the range between 0.7V and 2.0V.

Please refer to FIG. 3D. While a read action (Read) is performed, the first select transistor $M_{SG1}$ is turned off. That is, the program path is turned off. Moreover, the second select transistor $M_{SG2}$ is turned on. That is, the read path is turned on. Since the non-volatile memory cell 200 is in the first storage state, the hot carriers (e.g., electrons) are stored in the shared floating gate of the first floating gate transistor $M_{FG1}$ and the second floating gate transistor $M_{FG2}$. Consequently, the magnitude of the read current $I_R$ generated by the second floating gate transistor $M_{FG2}$ in the read path is higher.

Please refer to FIG. 3E. Since the non-volatile memory cell 200 is in the second storage state, no hot carriers (e.g., electrons) are stored in the shared floating gate of the first floating gate transistor $M_{FG1}$ and the second floating gate transistor $M_{FG2}$. Consequently, the magnitude of the read current $I_R$ generated by the second floating gate transistor $M_{FG2}$ in the read path is very low (i.e., nearly zero).

As mentioned above, while the read action is performed, the read path of the non-volatile memory cell 200 is turned on. Consequently, the non-volatile memory cell 200 generates the read current $I_R$. According to the magnitude of the read current $I_R$, the storage state of the non-volatile memory cell 200 is determined as the first storage state or the second storage state. Moreover, a reference current is provided. If the read current $I_R$ is higher than the reference current, the non-volatile memory cell 200 is in the first storage state. Whereas, if the read current $I_R$ is lower than the reference current, the non-volatile memory cell 200 is in the second storage state.

In the above embodiment, during the read action, the second voltage Vdd is provided to both of the program bit line BLP and the program word line WLP in order to turn off the program path.

In some other embodiments, the second voltage Vdd is provided to one of the program bit line BLP and the program word line WLP in order to turn off the program path. For example, in another embodiment, the program source line SLP receives the second voltage Vdd, the program bit line BLP receives the ground voltage (0V), and the program word line WLP receives the second voltage Vdd. Consequently, the program path is turned off. Alternatively, the program source line SLP receives the second voltage Vdd, the program bit line BLP receives the second voltage Vdd, and the program word line WLP receives the ground voltage (0V). Consequently, the program path is turned off.

As mentioned above, compared with the first voltage Vpp, the magnitude of the second voltage Vdd received by the program source line SLP is very low. Consequently, even if the program path is turned on during the read action, no hot carriers can be injected into the floating gate of the first floating gate transistor. In other words, even if the program path is turned on during the read action, the judging result of the non-volatile memory cell 200 is not adversely affected.

Figure 4:
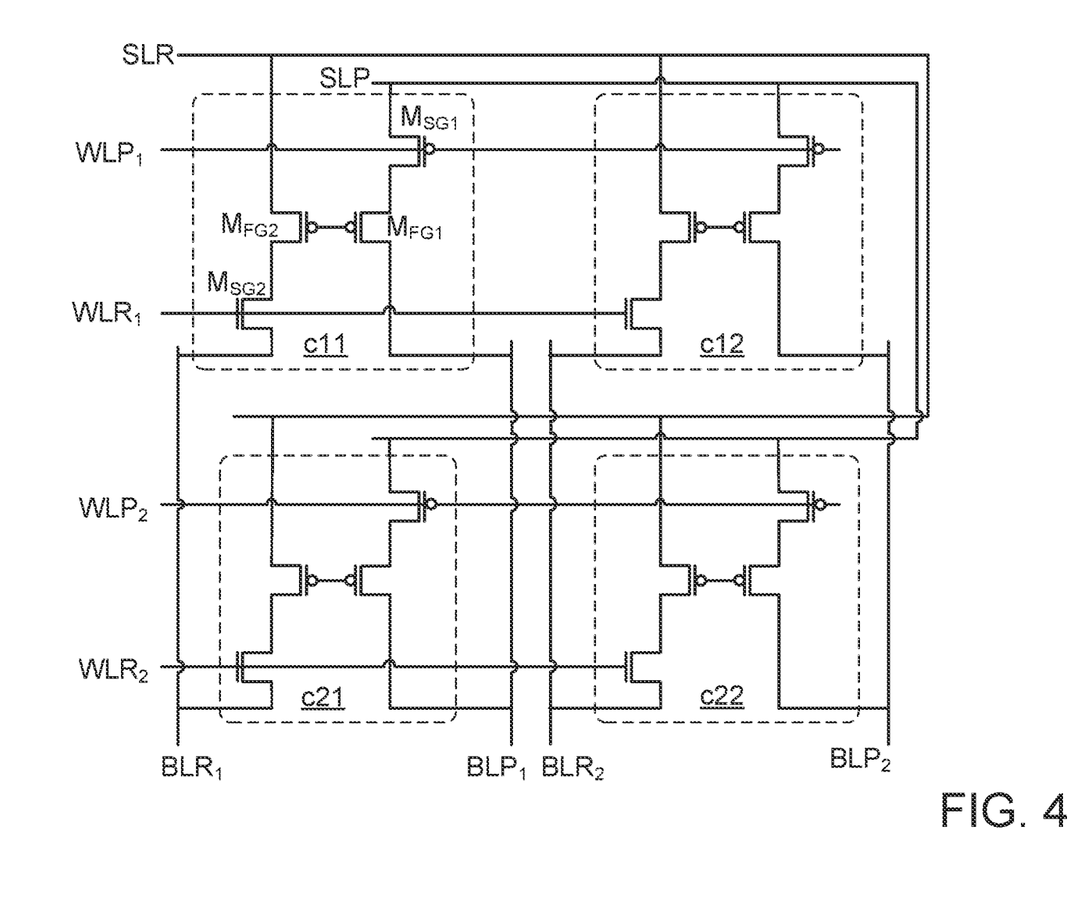
FIG. 4 is a schematic equivalent circuit diagram illustrating a non-volatile memory cell array with plural non-volatile memory cells of the present invention.

Moreover, plural non-volatile memory cells can be combined as a non-volatile memory cell array. FIG. 4 is a schematic equivalent circuit diagram illustrating a non-volatile memory cell array with plural non-volatile memory cells of the present invention. The non-volatile memory cell array comprises M×N non-volatile memory cells, wherein M and N are positive integers. For illustration, the non-volatile memory cell array of this embodiment comprises 2×2 non-volatile memory cells c11~c22. Each of the non-volatile memory cells c11~c22 has the structure as shown in FIG. 2B.

The equivalent circuit of the non-volatile memory cell c11 will be described as follows. The first source/drain terminal of the first select transistor $M_{SG1}$ is connected with the program source line SLP. The gate terminal of the first select transistor $M_{SG1}$ is connected with the program word line $WLP_1$. The second source/drain terminal of the first floating transistor $M_{FG1}$ is connected with the program bit line $BLP_1$. The first source/drain terminal of the second floating transistor $M_{FG2}$ is connected with the read source line SLR. The gate terminal of the second select transistor $M_{SG2}$ is connected with the read word line $WLR_1$. The second source/drain terminal of the second select transistor $M_{SG2}$ is connected with the read bit line $BLR_1$.

The two non-volatile memory cells c11 and c12 in the first row of the non-volatile memory cell array are connected with the program source line SLP, the read source line SLR, the program word line $WLP_1$ and the read word line $WLR_1$. The non-volatile memory cell c11 is connected with the program bit line $BLP_1$ and the read bit line $BLR_1$. In addition, the non-volatile memory cell c12 is connected with the program bit line $BLP_2$ and the read bit line $BLR_2$.

The two non-volatile memory cells c21 and c22 in the second row of the non-volatile memory cell array are connected with the program source line SLP, the read source line SLR, the program word line $WLP_2$ and the read word line $WLR_2$. The non-volatile memory cell c21 is connected with the program bit line $BLP_1$ and the read bit line $BLR_1$. In addition, the non-volatile memory cell c22 is connected with the program bit line $BLP_2$ and the read bit line $BLR_2$.

Figure 5A:
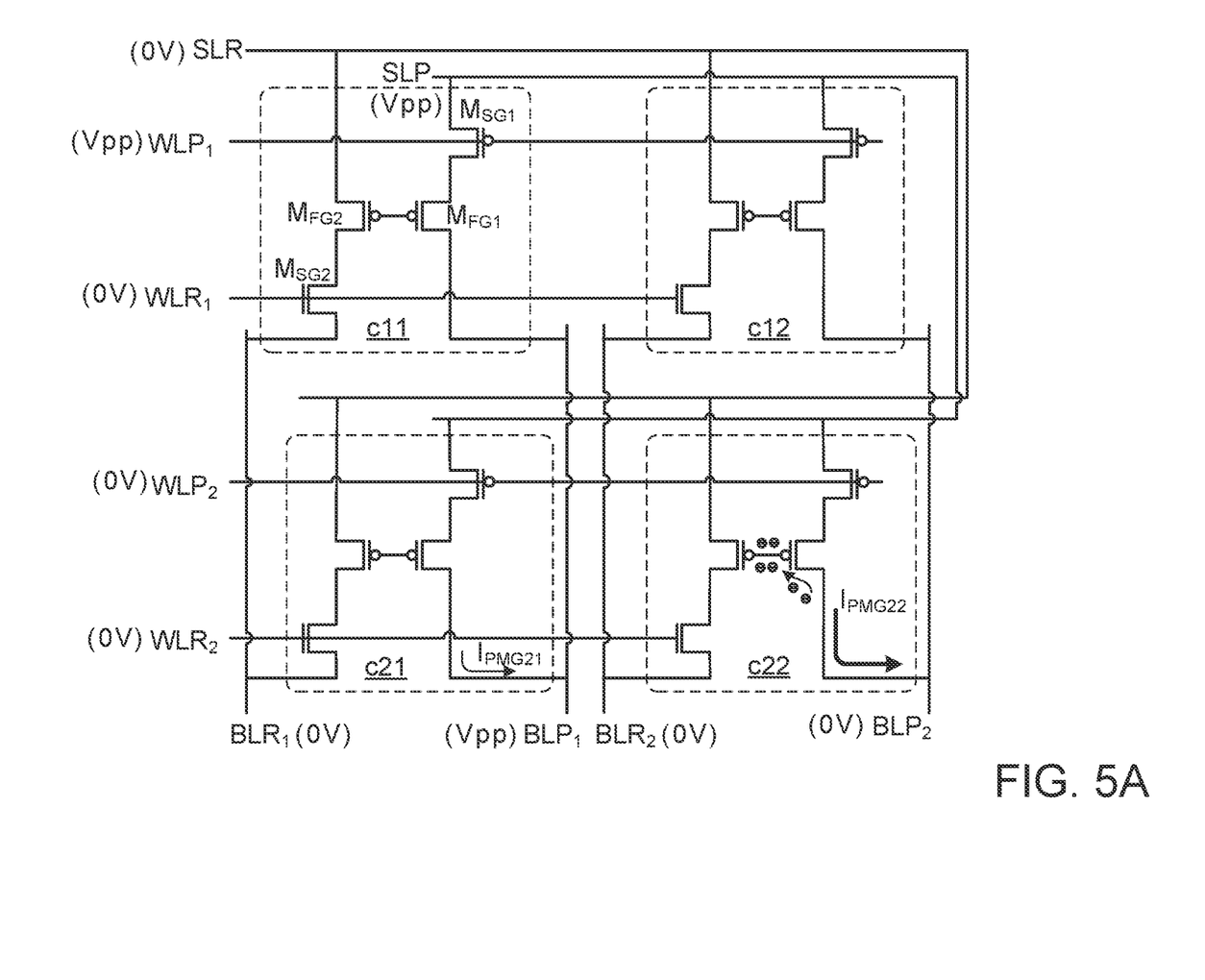
FIGS. 5A and 5B schematically illustrate associated voltage signals for programming and reading the non-volatile memory cell array of the present invention.
Figure 5B:
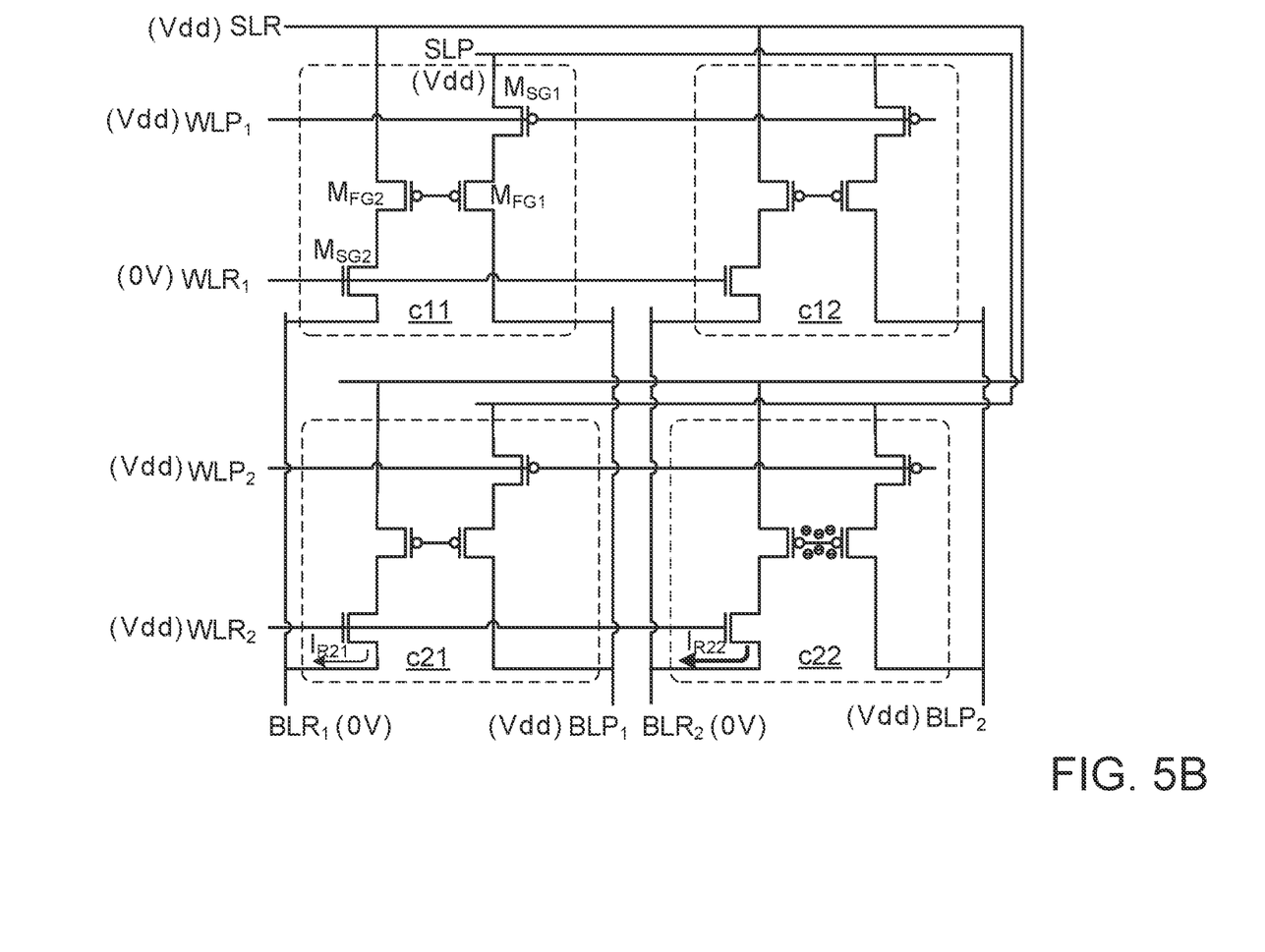

FIGS. 5A and 5B schematically illustrate associated voltage signals for programming and reading the non-volatile memory cell array of the present invention. In the following example, the non-volatile memory cell c21 is programmed to the second storage state, and the non-volatile memory cell c22 is programmed to the first storage state. While the read action is performed, the read currents of the non-volatile memory cell c21 and the non-volatile memory cell c22 are read.

Please refer to FIG. 5A. While the program action is performed, the program source line SLP receives the first voltage Vpp, the read source line SLR receives the ground voltage (0V), the program word line WLP1 receives the first voltage Vpp, and the read word line WLR1 receives the ground voltage (0V). Consequently, the first row of the non-volatile memory cell array is the unselected row. Under this circumstance, the program paths and the read paths of the two non-volatile memory cells c11 and c12 in the first row of the non-volatile memory cell array are turned off.

Moreover, the program word line $WLP_2$ receives the ground voltage (0V), and the read word line $WLR_2$ receives the ground voltage (0V). Consequently, the second row of the non-volatile memory cell array is the selected row. Under this circumstance, the read paths of the two non-volatile memory cells c21 and c22 in the second row of the non-volatile memory cell array are turned off.

In the non-volatile memory cell c21, the program bit line $BLP_1$ receives the first voltage Vpp, and the read bit line $BLR_1$ receives the ground voltage (0V). Consequently, the magnitude of the program current $I_{PGM21}$ in the program path of the non-volatile memory cell c21 is very low (i.e., nearly zero). The hot carriers (e.g., electrons) cannot be injected into the floating gate of the floating gate transistor.

Under this circumstance, the non-volatile memory cell c21 is programmed to the second storage state.

In the non-volatile memory cell c22, the program bit line $BLP_2$ receives the ground voltage (0V), and the read bit line $BLR_2$ receives the ground voltage (0V). Consequently, the magnitude of the program current $I_{PGM22}$ in the program path of the non-volatile memory cell c22 is higher. The hot carriers (e.g., electrons) are injected into the floating gate of the floating gate transistor. Under this circumstance, the non-volatile memory cell c22 is programmed to the first storage state.

Please refer to FIG. 5B. While the read action is performed, the program source line SLP receives the second voltage Vdd, the read source line SLR receives the second voltage Vdd, the program word line WLP1 receives the second voltage Vdd, and the read word line WLR1 receives the ground voltage (0V). Consequently, the first row of the non-volatile memory cell array is the unselected row. Under this circumstance, the program paths and the read paths of the two non-volatile memory cells c11 and c12 in the first row of the non-volatile memory cell array are turned off.

Moreover, the program word line $WLP_2$ receives the second voltage Vdd, and the read word line $WLR_2$ receives the second voltage Vdd. Consequently, the second row of the non-volatile memory cell array is the selected row. Under this circumstance, the program paths of the two non-volatile memory cells c21 and c22 in the second row of the non-volatile memory cell array are turned off.

In the non-volatile memory cell c21, the read bit line $BLR_1$ receives the ground voltage (0V), and the program bit line $BLP_1$ receives the second voltage Vdd. Since no hot carriers are stored in the floating gate of the floating gate transistor, the magnitude of the read current $I_{R21}$ generated by the read path of the non-volatile memory cell c21 is very low (i.e., nearly zero). Under this circumstance, the storage state of the non-volatile memory cell c21 is determined as the second storage state.

In the non-volatile memory cell c22, the read bit line $BLR_1$ receives the ground voltage (0V), and the program bit line $BLP_2$ receives the second voltage Vdd. Since hot carriers are stored in the floating gate of the floating gate transistor, the magnitude of the read current $I_{R22}$ generated by the read path of the non-volatile memory cell c22 is higher. Under this circumstance, the storage state of the non-volatile memory cell c22 is determined as the first storage state.

From the above descriptions, the present invention provides a non-volatile memory cell and a non-volatile memory cell array with plural non-volatile memory cells. Each non-volatile memory cell comprises a program path and a read path. A first select transistor and a first floating gate transistor are serially connected with each other to define the program path. A second select transistor and a second floating gate transistor are serially connected with each other to define the read path. The second select transistor is a low voltage device (LV device). Consequently, a low voltage is used to perform the read action on the non-volatile memory cell.

For protecting the first floating gate transistor and the second floating gate transistor of the non-volatile memory cell, a silicide blocking layer is formed to completely cover the second gate structure after the second gate structure is formed. Since the floating gate is protected by the silicide blocking layer, the data retention time of the non-volatile memory array can be extended.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A non-volatile memory cell array comprising a first non-volatile memory cell, the first non-volatile memory cell comprising:
    a first select transistor, wherein a first source/drain terminal of the first select transistor is connected with a program source line, and a gate terminal of the first select transistor is connected with a first program word line;
    a first floating gate transistor, wherein a first source/drain terminal of the first floating gate transistor is connected with a second source/drain terminal of the first select transistor, and a second source/drain terminal of the first floating gate transistor is connected with a first program bit line;
    a second floating gate transistor, wherein a first source/drain terminal of the second floating gate transistor is connected with a read source line, and a floating gate of the second floating gate transistor is connected with a floating gate of the first floating gate transistor; and
    a second select transistor, wherein a first drain/source terminal of the second select transistor is connected with a second source/drain terminal of the second floating gate transistor, a gate terminal of the second select transistor is connected with a first read word line, and a second source/drain terminal of the second select transistor is connected with a first read bit line.

2. The non-volatile memory cell array as claimed in claim 1, wherein a gate oxide layer of the second select transistor is thinner than a gate oxide layer of the first select transistor.

3. The non-volatile memory cell array as claimed in claim 1, wherein the first select transistor, the first floating gate transistor and the second floating gate transistor are fabricated by a medium voltage device manufacturing process, and the second select transistor is fabricated by a low voltage device manufacturing process.

4. The non-volatile memory cell array as claimed in claim 1, wherein the first select transistor, the first floating gate transistor and the second floating gate transistor are p-type transistors, and the second select transistor is an n-type transistor.

5. The non-volatile memory cell array as claimed in claim 4, wherein while a program action is performed, the program source line receives a first voltage, the first program word line receives a ground voltage, the first program bit line receives the ground voltage, the read source line receives the ground voltage, the first read word line receives the ground voltage, and the first read bit line receives the ground voltage, so that the first non-volatile memory cell is programmed to a first storage state.

6. The non-volatile memory cell array as claimed in claim 5, wherein a magnitude of the first voltage is in a range between 5.0V and 12V.

7. The non-volatile memory cell array as claimed in claim 5, wherein while a read action is performed, the program source line receives a second voltage less than the first voltage, the first program word line receives the second voltage, the first program bit line receives the second voltage, the read source line receives the second voltage, the first read word line receives the second voltage, and the first read bit line receives a ground voltage, so that the first non-volatile memory cell generates a read current, wherein if the read current is higher than a reference current, the first non-volatile memory cell is in a first storage state, wherein if the read current is lower than the reference current, the first non-volatile memory cell is in a second storage state.

8. The non-volatile memory cell array as claimed in claim 7, wherein a magnitude of the second voltage is in a range between 0.7V and 2.0V.

9. The non-volatile memory cell array as claimed in claim 1, wherein the non-volatile memory cell array further comprises a second non-volatile memory cell, and the second non-volatile memory cell comprises:
   a third select transistor, wherein a first source/drain terminal of the third select transistor is connected with the program source line, and a gate terminal of the third select transistor is connected with the first program word line;
   a third floating gate transistor, wherein a first source/drain terminal of the third floating gate transistor is connected with a second source/drain terminal of the third select transistor, and a second source/drain terminal of the third floating gate transistor is connected with a second program bit line;
   a fourth floating gate transistor, wherein a first source/drain terminal of the fourth floating gate transistor is connected with the read source line, and a floating gate of the fourth floating gate transistor is connected with a floating gate of the third floating gate transistor; and
   a fourth select transistor, wherein a first source/drain terminal of the fourth select transistor is connected with a second source/drain terminal of the fourth floating gate transistor, a gate terminal of the fourth select transistor is connected with the first read word line, and a second source/drain terminal of the fourth transistor is connected with a second read bit line.

10. The non-volatile memory cell array as claimed in claim 1, wherein the non-volatile memory cell array further comprises a second non-volatile memory cell, and the second non-volatile memory cell comprises:
   a third select transistor, wherein a first source/drain terminal of the third select transistor is connected with the program source line, and a gate terminal of the third select transistor is connected with a second program word line;
   a third floating gate transistor, wherein a first source/drain terminal of the third floating gate transistor is connected with a second source/drain terminal of the third select transistor, and a second source/drain terminal of the third floating gate transistor is connected with the first program bit line;
   a fourth floating gate transistor, wherein a first source/drain terminal of the fourth floating gate transistor is connected with the read source line, and a floating gate of the fourth floating gate transistor is connected with a floating gate of the third floating gate transistor; and
   a fourth select transistor, wherein a first source/drain terminal of the fourth select transistor is connected with a second source/drain terminal of the fourth floating gate transistor, a gate terminal of the fourth select transistor is connected with a second read word line, and a second source/drain terminal of the fourth transistor is connected with the first read bit line.

11. The non-volatile memory cell array as claimed in claim 1, wherein the first non-volatile memory cell comprises:
   a semiconductor substrate, wherein a N-well region and a P-well region are formed in a surface of the semiconductor substrate;
   a first gate structure formed over the N-well region, wherein the first gate structure is connected with the first program word line;
   a second gate structure formed over the N-well region;
   a first p-type doped region formed in the N-well region, wherein the first p-type doped region is located beside a first side of the first gate structure, and the first p-type doped region is connected with the program source line;
   a second p-type doped region formed in the N-well region, wherein the second p-type doped region is arranged between a second side of the first gate structure and a first side of the second gate structure;
   a third p-type doped region formed in the N-well region, wherein the third p-type doped region is located beside a second side of the second gate structure, and the third p-type doped region is connected with the first program bit line;
   a fourth p-type doped region formed in the N-well region, wherein the fourth p-type doped region is located beside the first side of the second gate structure, the fourth p-type doped region is connected with the read source line, and the fourth p-type doped region is not contacted with the second p-type doped region;
   a fifth p-type doped region formed in the N-well region, wherein the fifth p-type doped region is located beside the second side of the second gate structure, and the fifth p-type doped region is not contacted with the third p-type doped region;
   a third gate structure formed over the P-well region, wherein the third gate structure is connected with the first read word line;
   a first n-type doped region formed in the P-well region, wherein the first n-type doped region is located beside a first side of the third gate structure;
   a second n-type doped region formed in the P-well region, wherein the second n-type doped region is located beside a second side of the third gate structure, and the second n-type doped region is connected with the first read bit line; and
   a metal layer, wherein the fifth p-type doped region and the first n-type doped region are connected with each other through the metal layer,
   wherein the first gate structure, the first p-type doped region and the second p-type doped region are collaboratively formed as the first select transistor,
   wherein the second gate structure, the second p-type doped region and the third p-type doped region are collaboratively formed as the first floating gate transistor,
   wherein the second gate structure, the fourth p-type doped region and the fifth p-type doped region are collaboratively formed as the second floating gate transistor,
   wherein the third gate structure, the first n-type doped region and the second n-type doped region are collaboratively formed as the second select transistor.

12. The non-volatile memory cell array as claimed in claim 11, wherein the first gate structure comprises a first gate oxide layer and a first polysilicon gate layer, the second gate structure comprises a second gate oxide layer and a second polysilicon gate layer, and the third gate structure comprises a third gate oxide layer and a third polysilicon gate layer, wherein the first gate oxide layer and the second gate oxide layer are contacted with the N-well region, and the third gate oxide layer is contacted with the P-well region, wherein the first polysilicon gate layer covers the first gate oxide layer, the second polysilicon gate layer covers the second gate oxide layer, and the third polysilicon gate layer covers the third gate oxide layer, wherein the first polysilicon gate layer is connected with the first program word line, and the third polysilicon gate layer is connected with the first read word line.

13. The non-volatile memory cell array as claimed in claim 12, wherein the first gate oxide layer is thicker than the third gate oxide layer, and the second gate oxide layer is thicker than the third gate oxide layer.

14. The non-volatile memory cell array as claimed in claim 11, wherein the first non-volatile memory cell further comprises a silicide blocking layer, and the second gate structure is completely covered by the silicide blocking layer.

15. The non-volatile memory cell array as claimed in claim 11, wherein an area of an active region of the first floating gate transistor and an area of an active region of the second floating transistor are different.

16. The non-volatile memory cell array as claimed in claim 15, wherein the area of the active region of the first floating gate transistor is larger than the area of the active region of the second floating gate transistor.

17. The non-volatile memory cell array as claimed in claim 15, wherein the area of the active region of the second floating gate transistor is smaller than the area of the active region of the first floating gate transistor.

* * * * *